United States Patent
Kim (10) Patent No.: US 9,659,665 B1
(45) Date of Patent: May 23, 2017

(54) SENSING CONTROL SIGNAL GENERATION CIRCUIT AND SEMICONDUCTOR MEMORY DEVICE INCLUDING THE SAME

(71) Applicant: SK hynix Inc., Gyeonggi-do (KR)

(72) Inventor: Young-Il Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/164,309

(22) Filed: May 25, 2016

(30) Foreign Application Priority Data

Dec. 23, 2015 (KR) .......................... 10-2015-0185172

(51) Int. Cl.
*G11C 7/00* (2006.01)
*G11C 16/26* (2006.01)
*G11C 16/12* (2006.01)
*G11C 16/24* (2006.01)
*G11C 16/04* (2006.01)

(52) U.S. Cl.
CPC .......... *G11C 16/26* (2013.01); *G11C 16/0483* (2013.01); *G11C 16/12* (2013.01); *G11C 16/24* (2013.01)

(58) Field of Classification Search
USPC ........... 365/189.16, 189.05, 189.011, 230.08
See application file for complete search history.

(56) References Cited

U.S. PATENT DOCUMENTS

| 6,982,905 | B2 | 1/2006 | Nguyen | |
|---|---|---|---|---|
| 2012/0191923 | A1* | 7/2012 | Pekny | G11C 11/5642 711/154 |
| 2014/0168072 | A1* | 6/2014 | Hou | G06F 3/017 345/156 |

FOREIGN PATENT DOCUMENTS

KR 1020150028855 3/2015

* cited by examiner

*Primary Examiner* — Vu Le
(74) *Attorney, Agent, or Firm* — IP & T Group LLP (57) ABSTRACT

The present invention relates to a sensing control signal generation circuit and a semiconductor memory device including the same. In an embodiment, a semiconductor memory device may include a memory block suitable for including a plurality of memory cells coupled in series and a plurality of cell strings respectively coupled to a plurality of bit lines, page buffers suitable for being coupled to the respective bit lines in response to a sensing control signal and each suitable for sensing a voltage of each of the bit lines transferred to a sensing node and storing data corresponding to the results of the sensing or temporarily storing data to be programmed into a selected memory cell, and a sensing control signal generation unit suitable for generating the sensing control signal having a form of a ramping signal rising at a constant slope during the program operation.

21 Claims, 9 Drawing Sheets

SENSING CONTROL SIGNAL GENERATION CIRCUIT AND SEMICONDUCTOR MEMORY DEVICE INCLUDING THE SAME

CROSS-REFERENCE TO RELATED APPLICATION

The present application claims priority of Korean Patent Application No. 10-2015-0185172 filed on Dec. 23, 2015, which is incorporated herein by reference in its entirety.

BACKGROUND

1. Field

Exemplary embodiments of the present invention relate to a semiconductor design technology and, more particularly, to a semiconductor memory device including a sensing control signal generation unit.

2. Description of the Related Art

Semiconductor memory devices are basically divided into volatile and nonvolatile memory devices.

A volatile memory device has faster read and write speeds, but data stored therein is lost when the power supply to the device is disconnected. A nonvolatile memory device has relatively slower read and write speeds, but retains data stored therein even when the power supply to the device is stopped. Accordingly, a nonvolatile memory device is used to store data that needs to be retained regardless of whether the power supply is on or off. Examples of a nonvolatile memory device include read only memory (ROM), mask ROM (MROM) programmable ROM (PROM), erasable programmable ROM (EPROM), electrically erasable programmable ROM (EEPROM), flash memory, phase change random access memory (PRAM), magnetic RAM (MRAM), resistive RAM (RRAM), and ferroelectric (RAM FRAM). The flash memory is widely used and is categorized into NOR and NAND flash memories.

A NAND flash memory has the advantage of RAM in that data can be freely programmed and erased and an advantage of a ROM in that stored data can be retained although the supply of power is stopped. Flash memory is widely used as the storage media of portable electronic devices, such as, for example, a digital camera, a personal digital assistant (PDA), and an MP3 player.

NAND flash memory typically includes a plurality of page buffers coupled to a plurality of bit lines in a one-to-one way through a sensing node. During a program operation, the page buffers are able to detect voltages of corresponding bit lines through the sensing node. When all of the memory cells coupled to a specific word line are to be programmed, a program permission voltage, for example, a ground voltage VSS is applied to all of the bit lines, and thus the voltage of the sensing node is driven to the ground voltage VSS. In contrast, when a program prohibition voltage, for example, a core voltage VCORE is applied to all of the bit lines, a voltage of the sensing node is driven to the core voltage VCORE. In this case, since voltages of all of the bit lines are changed at the same time, the peak current of the semiconductor memory device is increased.

SUMMARY

Various embodiments are directed to a semiconductor memory device capable of constantly maintaining a rising slope or a rising time of a sensing control signal even though total capacitance changes at an output node of the sensing control signal, the sensing control signal for controlling coupling between a page buffer and a bit line rises.

Also, various embodiments are directed to a semiconductor memory device capable of generating the sensing control signal through a bandgap signal having a compensated PVT variation and an operating method of the semiconductor memory device.

In an embodiment, a semiconductor memory device may include a memory block comprising a plurality of cell strings respectively coupled to a plurality of bit lines; page buffers coupled to the respective bit lines in response to a sensing control signal, each page buffer suitable for sensing a voltage of the respective bit line transferred to a sensing node; and a sensing control signal generation unit suitable for generating the sensing control signal as a ramping signal rising with a constant slope during a program operation.

In an embodiment, a sensing control signal generation circuit may include a program sensing control signal generation unit suitable for generating a sensing control signal as a ramping signal rising with a specific slope regardless of a data pattern during a program operation; and a read sensing control signal generation unit suitable for generating the sensing control signal as a level signal during a read operation.

In an embodiment, a method for generating a sensing control signal may include precharging a ramping node to a reference voltage during an initial period; at a first point of time, selecting one or more of biases having different intensities, providing the selected biases to the ramping node, generating a ramping signal rising with a specific slope at the ramping node by charging an internal capacitor with the selected biases, and outputting the ramping signal as a sensing control signal at a sensing control node by driving the ramping node while separating the ramping node from the sensing control node; and at a second point of time, additionally driving the sensing control node to a high voltage.

BRIEF DESCRIPTION OF THE DRAWINGS

The present invention will be described in reference to the accompanying figures, wherein.

DETAILED DESCRIPTION

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the relevant art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention. In addition, it will also be understood that when an element or layer is referred to as being "between" two elements or layers, it can be the only element or layer between the two elements or layers, or one or more intervening elements or layers may also be present.

It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or groups thereof.

The terminology used herein is for the purpose of describing particular embodiments only and is not intended to be limiting of the present invention. Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Hereinafter, the various embodiments of the present invention will be described in detail with reference to attached drawings.

Figure 1:
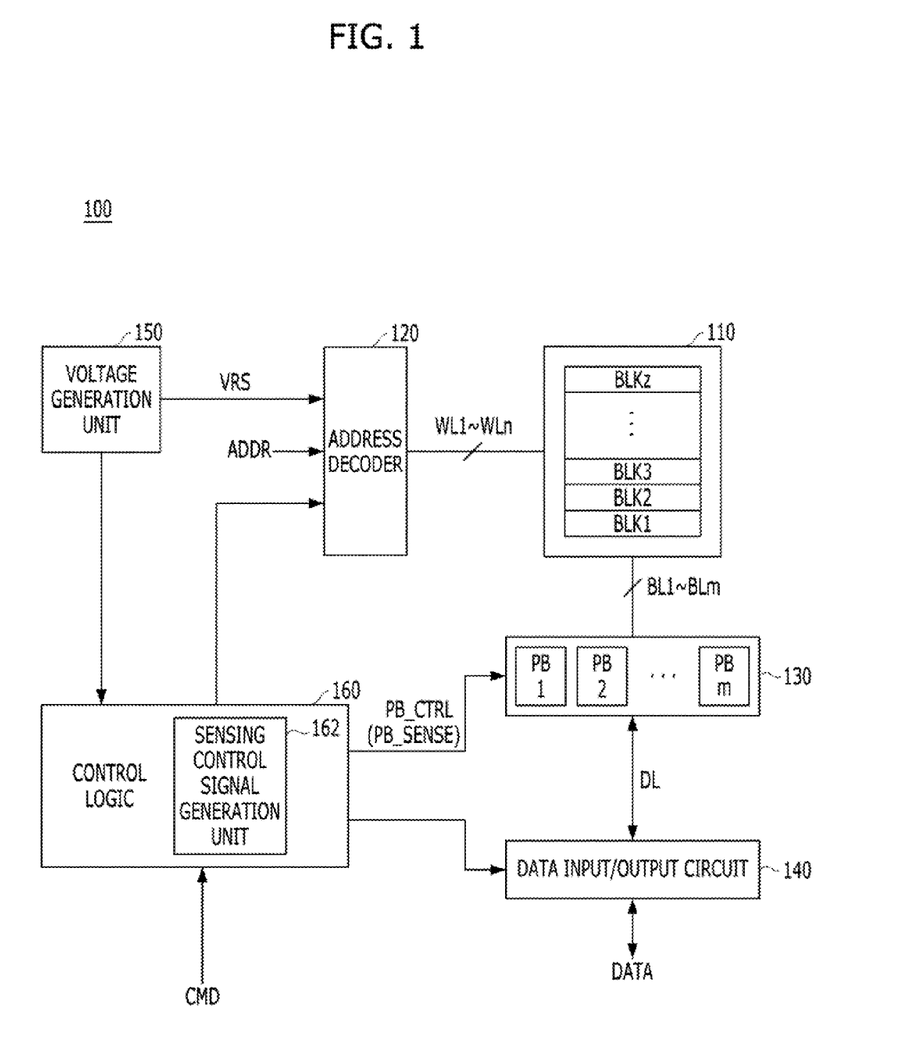
FIG. 1 is a block diagram of a semiconductor memory device, according to an embodiment of the present invention.

Referring now to FIG. 1 a semiconductor memory device 100 is provided, according to an embodiment of the present invention.

According to the embodiment illustrated in FIG. 1, the semiconductor memory device 100 may include a memory cell array 110, an address decoder 120, a read/write circuit 130, control logic 160, a voltage generation unit 150, and a data input/output circuit 140.

The memory cell array 110 may be coupled to the address decoder 120 through word lines WL1 to WLn and coupled to the read/write circuit 130 through bit lines BL1 to BLm. The memory cell array 110 may include a plurality of memory blocks BLK1 to BLKz. The plurality of memory blocks BLK1 to BLKz may include a plurality of memory cells. The plurality of memory cells may be coupled to the word lines WL1 to WLn in a row direction while coupled to the bit lines BL1 to BLm in a column direction. Each of the plurality of memory cells may operate as a single level cell (SLC) or a multi-level cell (MLC). In an embodiment, the plurality of memory cells may be nonvolatile memory cells.

Furthermore, each of the plurality of memory blocks BLK1 to BLKz of the memory cell array 110 may include a plurality of cell strings coupled to the respective bit lines BL1 to BLm. Each of the plurality of cell strings may include a drain selection transistor, a plurality of memory cells, and a source selection transistor coupled in series between each of the bit lines and a source line. The plurality of cell strings included in the memory cell array 110 is described in detail later.

The address decoder 120, the read/write circuit 130, the data input/output circuit 140, the voltage generation unit 150, and the control logic 160 may operate as peripheral circuits for driving the memory cell array 110. The address decoder 120 may be coupled to the memory cell array 110 through the word lines WL1 to WLn. The address decoder 120 may operate under the control of the control logic 160. The address decoder 120 may receive an external address ADDR. The address decoder 120 may generate a block address by decoding the external address ADDR and selects one of the plurality of memory blocks BLK1 to BLKz of the memory cell array 110 in response to the generated block address. The address decoder 120 may generate a row address by decoding the external address ADDR and selects one of the word lines WL1 to WLn, which is connected to a memory block selected in response to the generated row address. The address decoder 120 may include a block decoder, a row decoder, and an address buffer.

The read/write circuit 130 may be coupled to the memory cell array 110 through the bit lines BL1 to BLm and coupled to the data input/output circuit 140 through data lines DL. The read/write circuit 130 may operate in response to a read/write control signal PB_CTRL output from the control logic 160.

During the program operation, the read/write circuit 130 may transfers the program data DATA from the data input/output circuit 140 to the bit lines BL1 to BLm. The transferred data DATA is programmed into memory cells coupled to a selected word line. During the read operation, the read/write circuit 130 may transfer read data DATA from the memory cells of a selected word line to the data input/output circuit 140 through the bit lines BL1 to BLm and the data lines DL. During the erase operation, the read/write circuit 130 may make the bit lines BL1 to BLm floating.

The read/write circuit 130 may include a plurality of page buffers PB1 to PBm respectively corresponding to the bit lines BL1 to BLm and coupled to the memory cell array 110 through the corresponding bit lines BL1 to BLm. The plurality of page buffers PB1 to PBm may include a plurality of latches, respectively.

The data input/output circuit 140 may be coupled to the read/write circuit 130 through the data lines DL. The data input/output circuit 140 may operate under the control of the control logic 160. The data input/output circuit 140 may transfer data DATA between the memory cell array 110 and the outside. During the program operation, the data input/output circuit 140 may transfer program data DATA from the outside and to the read/write circuit 130. During the read operation, the data input/output circuit 140 may transfer read data DATA from the read/write circuit 130 to the outside.

The voltage supply unit 150 may generate operating voltages VRS for program/read/erase operations under the control of the control logic 160. The operating voltages VRS may include an erase voltage VERASE, a program voltage VPGM, a read voltage VREAD, a pass voltage VPASS, source line voltages VDSL and VSSL, a common source voltage VSL, and a pipe gate voltage VPG.

The control logic 160 may be coupled to the address decoder 120, the read/write circuit 130, the data input/output circuit 140, and the voltage supply unit 150. The control logic 160 may control an overall operation of the semiconductor memory device 100 in response to a command CMD provided through the input/output buffer (not shown) of the semiconductor memory device 100.

In an embodiment of the present invention, the control logic 160 may include a sensing control signal generation unit 162 for generating a sensing control signal PB_SENSE for controlling coupling between the page buffers PB1 to PBm and the respective bit lines BL1 to BLm. The sensing control signal generation unit 162 may generate the sensing control signal PB_SENSE which rises at a constant slope regardless of a data pattern, that is, which has a constant rising time.

The page buffer PB and the sensing control signal generation unit 162 according to an embodiment of the present invention is described in detail below with reference to FIG. 2.

Figure 2:
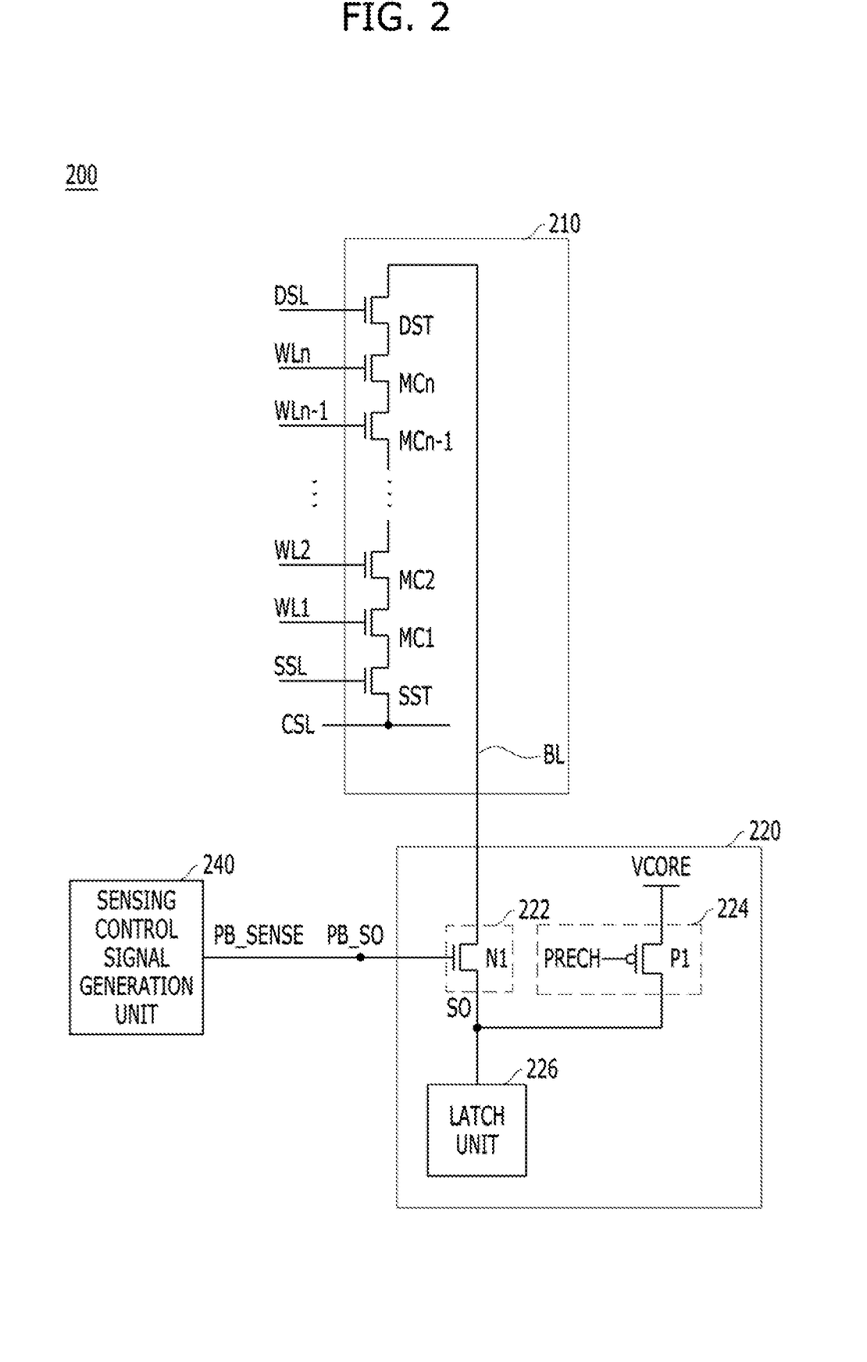
FIG. 2 is a detailed circuit diagram showing a configuration of a cell string and page buffer of the memory block shown in FIG. 1.
Figure 3:
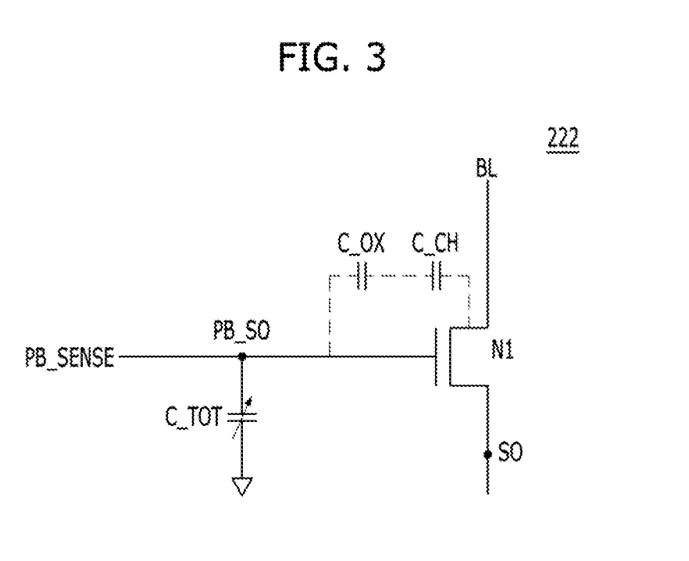
FIG. 3 is a circuit diagram of a total capacitance of the sensing control node of a coupling unit shown in FIG. 2.

FIG. 2 is a detailed circuit diagram showing the configuration of a cell string 210 and page buffer (PB) 220 of the memory block BLK shown in FIG. 1. FIG. 3 is a circuit diagram of total capacitance C_TOT of the sensing control node PB_SO of a coupling unit 222 shown in FIG. 2.

FIG. 2 representatively shows a single page buffer 220 coupled to a single cell string 210 through a single bit line BL in the semiconductor memory device 200.

The semiconductor memory device 200 may include a cell string 210 coupled in series between a source line CSL and the bit line BL, the bit line BL coupled to the cell string 210, and the page buffer 220. The page buffer 220 is configured to correspond to the bit line BL in a one-to-one way for sensing a voltage of the bit line BL through a sensing node SO. The semiconductor memory device 200 may further include a sensing control signal generation unit 240 for generating the sensing control signal PB_SENSE for controlling coupling between the page buffer 220 and the bit line BL. The sensing control signal generation unit 240 may have the same configuration as the sensing control signal generation unit 162 of the control logic 160 shown in FIG. 1.

The cell string 210 has a string structure in which a plurality of memory cells MC1 to MCn respectively coupled to a plurality of word lines WL1 to WLn are coupled in series between a source selection transistor SST coupled to a source selection line SSL and a drain selection transistor DST coupled to a drain selection line DSL. Various voltages may be applied to the floating gates of the plurality of memory cells MC1 to MCn through the plurality of word line WL1 to WLn. Each of the memory cells MC1 to MCn may be configured using an MLC for storing data of multiple bits. In another embodiment, each of the memory cells MC1 to MCn may be configured using a SLC for storing data of a single bit. Each of a plurality of cell strings may be electrically coupled to each of a plurality of bit lines BL1 to BLm, respectively. The memory strings may be arranged in any suitable bit line architecture including for example, an open bit line or a folded bit line architecture. The memory strings may be arranged in a plurality of memory cell arrays stacked vertically to form a three-dimensional structure.

The page buffer 220 may be electrically coupled to the bit line BL in response to the sensing control signal PB_SENSE. The page buffer 220 may sense a voltage of the bit line BL transferred to the sensing node SO. The page buffer 220 may also store sensing data or temporarily store data to be programmed into a selected memory cell.

The page buffer 220, according to the embodiment illustrated in FIG. 2, includes a coupling unit 222 for electrically coupling the bit line BL and the sensing node SO in response to the sensing control signal PB_SENSE. The page buffer 220 also includes a precharge unit 224 for precharging the sensing node SO to a core voltage VCORE in response to a precharge signal PRECH, and a latch unit 226 coupled to the sensing node SO for temporarily storing data to be programmed into a memory cell through the bit line BL or data read from a memory cell through the bit line BL.

The coupling unit 222 may include an NMOS transistor N1 coupled between the bit line BL and the sensing node SO. The NMOS transistor N1 receives the sensing control signal PB_SENSE at its gate. The precharge unit 224 may include a PMOS transistor P1 for precharging the sensing node SO to a precharge voltage, for example, a core voltage VCORE in response to the precharge signal PRECH.

The sensing control signal generation unit 240 may generate the sensing control signals PB_SENSE of different types during the program or read operation. For example, in an embodiment of the present invention, the sensing control signal generation unit 240 may generate the sensing control signal PB_SENSE having a constant value during a read operation while generating the sensing control signal PB_SENSE rising with a constant slope, i.e., having the form of a ramping signal during a program operation. Also for example, during a program operation, the sensing control signal PB_SENSE may have a form of a ramping signal which rises in a one-step having two different slops, or a two-step having three two different slops.

Even though FIG. 2 exemplifies one page buffer PB coupled to a cell string (or one bit line BL) and one sensing control signal generation unit 240 for generating the sensing control signal PB_SENSE for the single page buffer PB, the single sensing control signal generation unit 240 may control coupling between the plurality of bit lines BL1 to BLm and the plurality of page buffers PB1 to PBm. That is, when the sensing control signal generation unit 240 enables the sensing control signal PB_SENSE, all of the plurality of cell strings and the plurality of page buffers PB1 to PBm may be coupled.

In a nonvolatile memory device, such as NAND flash memory, a program operation is performed by applying a program voltage to a selected word line. Selected memory cells to be programmed need to be distinguished from non-selected memory cells not to be programmed because a plurality of memory cells is coupled to a single word line. To this end, during the program operation, a program permission voltage is applied to bit lines coupled to the selected memory cells, and a program prohibition voltage is applied to bit lines coupled to the non-selected memory cells. For example, the program permission voltage may be a ground voltage VSS, that is, a voltage of 0 V, and the program prohibition voltage may be a positive voltage, for example, a core voltage VCORE.

A sensing voltage of the sensing node SO of the page buffer PB coupled to the bit line BL is determined depending on whether a program has been performed, and a total capacitance C_TOT of the sensing control node PB_SO is determined by the sending voltage. For reference, when "m" number of the coupling units 222 for coupling between the plurality of bit lines BL1 to BLm and the plurality of page buffers PB1 to PBm are coupled to the sensing control node PB_SO, the total capacitance C_TOT of the sensing control node PB_SO is substantially determined by the sensing voltages of the sensing nodes SO of the plurality of page buffers PB1 to PBm coupled to the plurality of bit lines BL1 to BLm. However, an example in which the total capacitance C_TOT of the sensing control node PB_SO is determined by the sensing node SO of the page buffer PB coupled to a single bit line BL is described below for convenience of description.

According to the embodiment illustrated in FIG. 3, the total capacitance C_TOT of the sensing control node PB_SO may be modeled to a first capacitance C_OX between the gate of the NMOS transistor and a gate insulating layer and a second capacitance C_CH between the gate and a channel. The first and second capacitances C_OX and C_CH are coupled in series.

In this case, when all of the memory cells MC1 to MCn coupled to a specific word line WL are to be programmed, the program permission voltage is applied to all of the bit lines BL, and thus the sensing voltage of the sensing node SO of the page buffer PB becomes a ground voltage VSS. Accordingly, the second capacitance C_CH does not contribute to the total capacitance C_TOT of the sensing control node PB_SO but only the first capacitance C_OX does and thus the total capacitance C_TOT of the sensing control node PB_SO has a maximum capacitance.

In contrast, when a program for all of the memory cells MC1 to MCn coupled to a specific word line WL is prohibited, a program prohibition voltage is applied to all of the bit lines BL, and thus the sensing voltage of the sensing node SO of the page buffer PB becomes a core voltage VCORE. Accordingly, both of the first capacitance C_OX and the second capacitance C_CH contribute to the total capacitance C_TOT of the sensing control node PB_SO to have a minimum capacitance. When the total capacitance C_TOT of the sensing control node PB_SO is minimum, an electric current flowing into the sensing control node PB_SO is increased, and thus a peak current flows into the sensing control node PB_SO. Furthermore, when the total capacitance C_TOT of the sensing control node PB_SO changes according to whether the bit lines BL have been programmed or not, the slope of the sensing control signal PB_SENSE changes during the program operation. As a result, malfunction may occur because coupling between the page buffer PB and the bit line BL is unstable.

In an embodiment of the present invention, the sensing control signal generation unit 240 generates the sensing control signal PB_SENSE as a ramping signal having a constant slope by charging a capacitor insensitive to a skew change through a source follower including a unit gain buffer. Accordingly, the sensing control signal PB_SENSE has a constant slope although the total capacitance C_TOT of the sensing control node PB_SO changes according to a data pattern.

The sensing control signal generation unit 240, according to an embodiment of the present invention, is described in detail below with reference to FIG. 4.

Figure 4:
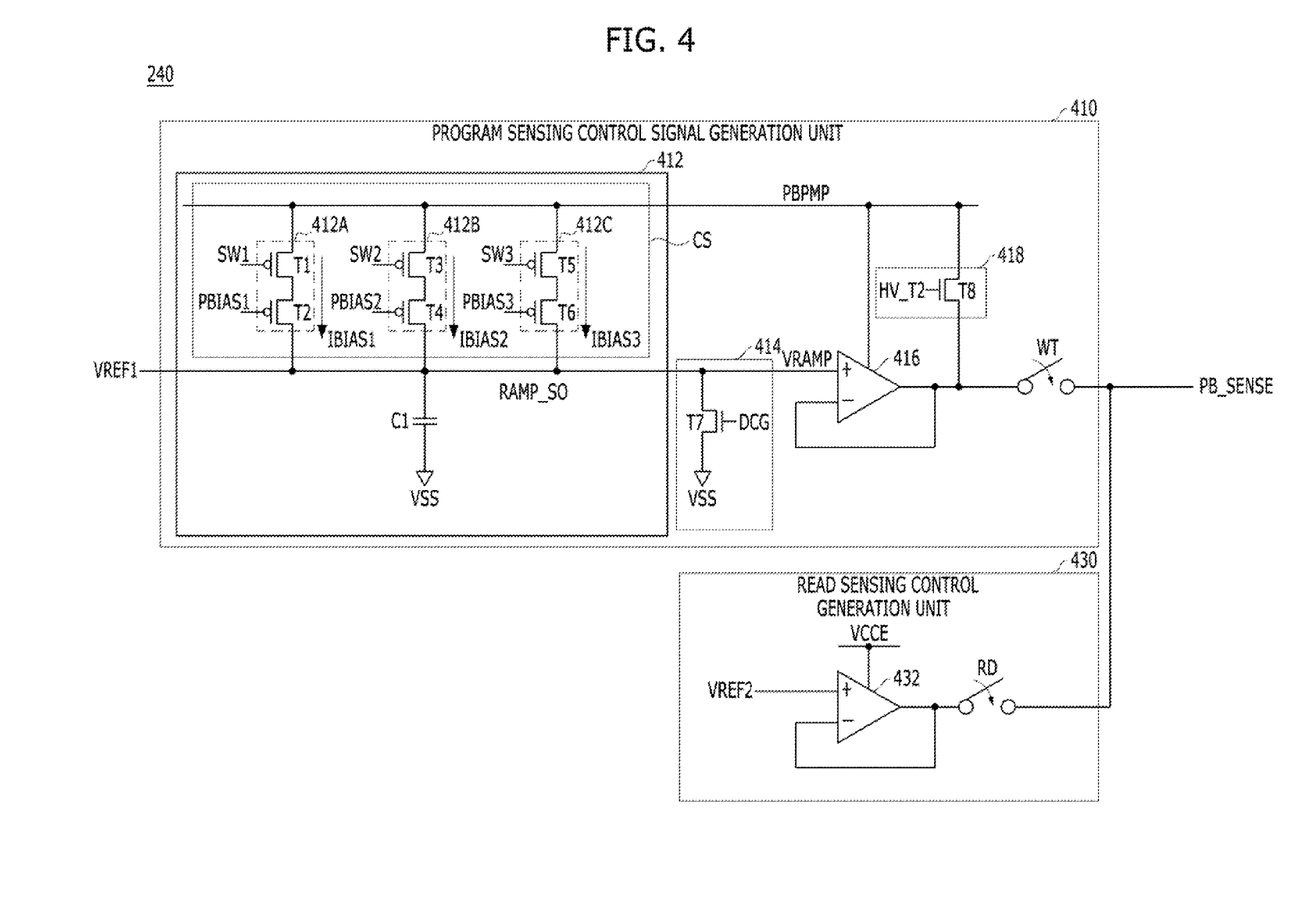
FIG. 4 is a circuit diagram of a sensing control signal generation unit shown in FIG. 2, according to an embodiment of the present invention.

FIG. 4 is a detailed circuit diagram of the sensing control signal generation unit 240 shown in FIG. 2, according to an embodiment of the present invention.

According to the embodiment illustrated in FIG. 4, the sensing control signal generation unit 240 may include a program sensing control signal generation unit 410 and a read sensing control signal generation unit 430. The program and the read sensing control signal generation units 410 and 430 may be selected in a mutually exclusive way. For example, the program sensing control signal generation unit 410 may output the sensing control signal PB_SENSE in response to a write signal WT, and the read sensing control signal generation unit 430 may output the sensing control signal PB_SENSE in response to a read signal RD.

The program sensing control signal generation unit 410 may generate the sensing control signal PB_SENSE as the ramping signal rising with a constant slope regardless of a data pattern during the program operation. The read sensing control signal generation unit 430 may generate the sensing control signal PB_SENSE as a level signal during the read operation. For reference, during the program operation, when a program prohibition voltage (e.g., a core voltage VCORE of 2.1 V) is applied to the bit line BL, the sensing control signal PB_SENSE needs to be driven to a high voltage PBPMP (e.g., 4.75 V) higher than the program prohibition voltage in order to fully turn on the coupling unit 222.

The read sensing control signal generation unit 430 may include a sensing control signal driving unit 432 for receiving a second reference voltage VREF2 and outputting the sensing control signal PB_SENSE to the sensing control node PB_SO. During the read operation, the second reference voltage VREF2 has a voltage corresponding to a bit line precharge voltage. Accordingly, the sensing control signal PB_SENSE may be the level signal. The sensing control signal driving unit 432 may be implemented with a source follower including a unit gain buffer for receiving an external power supply voltage VCCE as a driving voltage.

The program sensing control signal generation unit 410 may include a ramping signal generation unit 412, a discharge unit 414, and a sensing control signal driving unit 416. The ramping signal generation unit 412 may generate a ramping signal VRAMP at a ramping node RAMP_SO by charging an internal capacitance according to biases having different intensities. The discharge unit 414 may discharge the ramping node RAMP_SO to the ground voltage VSS in response to a discharge signal DCG. The sensing control signal driving unit 416 may output the ramping signal VRAMP as the sensing control signal PB_SENSE by driving the ramping node RAMP_SO while separating the ramping node RAMP_SO from the sensing control node PB_SO.

More specifically, the ramping signal generation unit 412 may include a current source CS for selecting one of the biases IBIAS1, IBIAS2, and IBIAS3 having different intensities and providing the selected bias, and a capacitor C1 for generating the ramping signal VRAMP at the ramping node RAMP_SO according to the selected bias.

The current source CS may include first to third biasing units 412A, 412B, and 412C coupled in parallel between a node for the high voltage PBPMP and the ramping node RAMP_SO.

The first biasing unit 412A may include first and second transistors T1 and T2 coupled in series between the node for the high voltage PBPMP and the ramping node RAMP_SO and output the first bias IBIAS1. The first transistor T1 is turned on in response to a first switch signal SW1, and the second transistor T2 is turned on in response to a first bandgap signal PBIAS1. The second biasing unit 4128 may include third and fourth transistors T3 and T4 coupled in series between the node for the high voltage PBPMP and the ramping node RAMP_SO and outputs the second bias IBIAS2. The third transistor T3 is turned on in response to a second switch signal SW2. The fourth transistor T4 is turned on in response to a second bandgap signal PBIAS2. The third biasing unit 412C may include fifth and sixth transistors T5 and T6 coupled in series between the node for the high voltage PBPMP and the ramping node RAMP_SO and output the third bias IBIAS3. The fifth transistor T5 is turned on in response to a third switch signal SW3. The sixth transistor T6 is turned on in response to a third bandgap signal PBIAS3.

The first to the third switch signals SW1 to SW3 turns on/off the first to the third biasing units 412A to 412C, respectively, and the first to the third bandgap signals PBIAS1 to PBIAS3 controls the intensities of the biases IBIAS1, IBIAS2, and IBIAS3.

For example, the first bandgap signal PBIAS1 may have the greatest intensity, and the third bandgap signal PBIAS3 may have the smallest intensity. In an embodiment, the first to the third bandgap signals PBIAS1 to PBIAS3 may have the same intensity. The second, the fourth and the sixth transistors T2, T4 and T6 may be configured in different sizes. In an embodiment of the present invention, the first to the third bandgap signals PBIAS1 to PBIAS3 may be generated by an internal bandgap circuit (not shown) and may have a compensated PVT variation. Accordingly, the semiconductor memory device according to an embodiment may reduce a peak current changing according to a change of a power supply voltage and temperature because it generates the sensing control signal PB_SENSE using the bandgap signals having the compensated PVT variation.

The capacitor C1 is coupled to the ramping node RAMP_SO and a node for the ground voltage VSS, and generates the ramping signal VRAMP at the ramping node RAMP_SO using the bias provided from the current source CS. In an embodiment of the present invention, the capacitor C1 may be configured using an oxide-nitride-oxide layer (ONO) capacitor insensitive to a skew change. Accordingly, the semiconductor memory device according to an embodiment can minimize a skew change because it generates the sensing control signal PB_SENSE by charging the capacitor C1 which is insensitive to a skew change.

The discharge unit 414 is coupled to the ramping node RAMP_SO and the node for the ground voltage VSS, and discharges the ramping node RAMP_SO of the ramping signal VRAMP to a ground voltage VSS after completion of the program operation. In an embodiment, the discharge unit 414 may be implemented with a seventh transistor T7 coupled to the ramping node RAMP_SO and the node for the ground voltage VSS, and receive the discharge signal DCG through its gate.

The sensing control signal driving unit 416 is implemented with a source follower including a unit gain buffer configured to receive the high voltage PBPMP as a driving voltage, and thus drives the ramping node RAMP_SO while separating the ramping node RAMP_SO from the sensing control node PB_SO.

The program sensing control signal generation unit 410 may further include a high voltage charging unit 418. The high voltage charging unit 418 drives the sensing control node PB_SO to the high voltage PBPMP at specific point of time (e.g., t2 of FIG. 5) after the sensing control signal PB_SENSE rises with a constant slope during a specific section of time. The high voltage charging unit 418 additionally drives the sensing control node PB_SO of the sensing control signal PB_SENSE when the sensing control signal PB_SENSE has not risen to a sufficient level.

Figure 5:
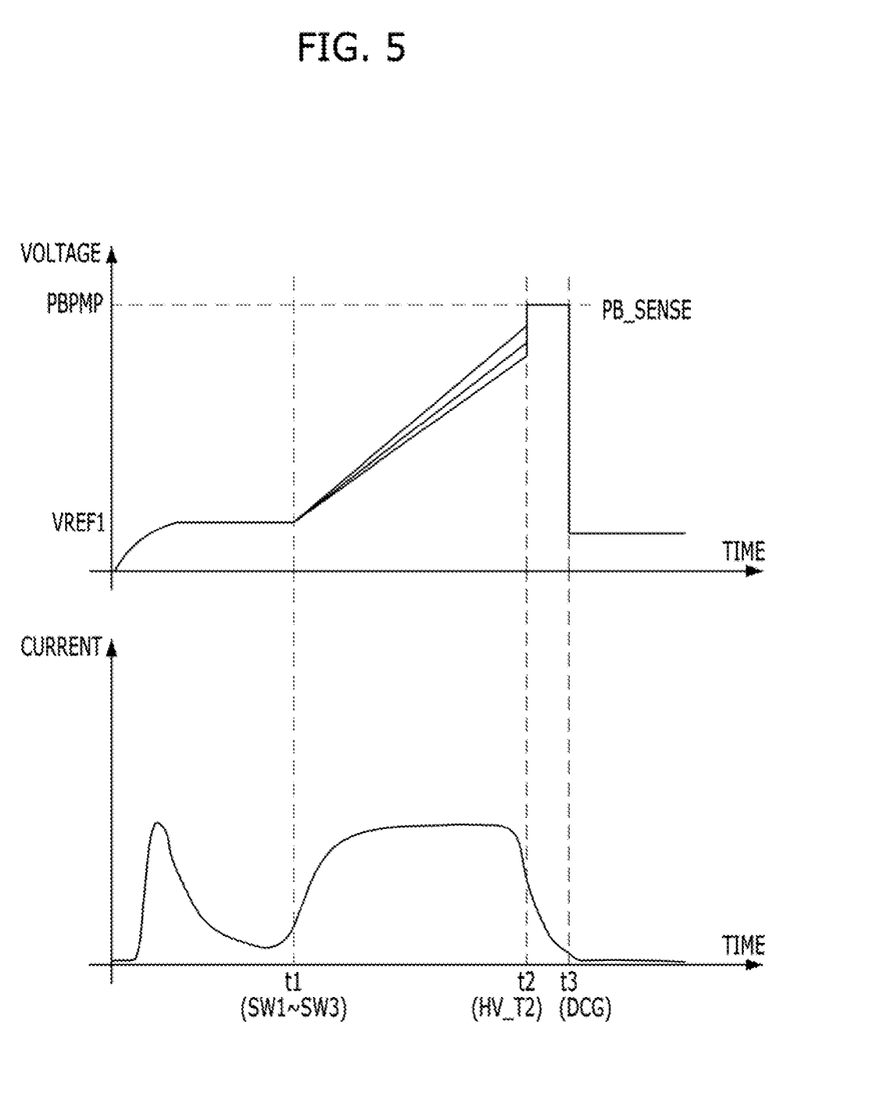
FIG. 5 is a waveform diagram illustrating a sensing control signal generated by a program sensing control signal generation unit of FIG. 4 and a peak current generated in response to the sensing control signal.

The high voltage charging unit 418 may be implemented with an eighth transistor T8 coupled between the node for the high voltage PBPMP and the output node of the sensing control signal driving unit 416, and configured to receive a high voltage enable signal HV_T2 enabled through its gate at a specific point of time (t2 of FIG. 5).

As described above, the program sensing control signal generation unit 410 generates the ramping signal VRAMP having a constant slope at the ramping node RAMP_SO by charging a capacitor that is insensitive to a skew change, drives the ramping node RAMP_SO while separating the ramping node RAMP_SO from the sensing control node PB_SO using the source follower including the unit gain buffer, and outputs the ramping signal VRAMP as the sensing control signal PB_SENSE. Accordingly, the sensing control signal PB_SENSE rising with a constant slope can be generated although the total capacitance C_TOT of the sensing control node PB_SO changes.

FIG. 5 illustrates the sensing control signal PB_SENSE generated by the program sensing control signal generation unit 410 of FIG. 4 and a peak current IPEAK generated in response to the sensing control signal PB_SENSE during a program operation.

According to the embodiment illustrated in FIGS. 4 and 5, during an initial period before a first point of time "t1", the ramping node RAMP_SO is precharged with a first reference voltage VREF1. The first reference voltage VREF1 may have a voltage level (e.g. 1 V) slightly higher than a threshold voltage of a transistor coupled to the ramping node RAMP_SO in order to turn on the transistor. In this case, the peak current IPEAK is generated according to the first reference voltage VREF1.

Thereafter, at the first point of time "t1", one or more of the first to the third switch signals SW1 to SW3 are enabled. Accordingly, the current source CS selects one or more of the biases IBIAS1, IBIAS2, and IBIAS3 having different intensities and provides the selected biases to the ramping node RAMP_SO. The capacitor C1 generates the ramping signal VRAMP at the ramping node RAMP_SO using the biases provided from the current source CS. In this case, the ramping signal VRAMP rises with a slope determined by the provided biases. The sensing control signal driving unit 416 outputs the ramping signal VRAMP as the sensing control signal PB_SENSE by driving the ramping node RAMP_SO while separating the ramping node RAMP_SO from the sensing control node PB_SO.

In this case, the program sensing control signal generation unit 410 generates the ramping signal VRAMP having a constant slope at the ramping node RAMP_SO by charging the capacitor C1 insensitive to a skew change and outputs the ramping signal VRAMP as the sensing control signal PB_SENSE by driving the ramping node RAMP_SO while separating the ramping node RAMP_SO from the sensing control node PB_SO using the source follower including a unit gain buffer. Accordingly, the sensing control signal PB_SENSE rising with the constant slope can be generated although the total capacitance C_TOT of the sensing control node PB_SO changes. Accordingly, the peak current IPEAK changing according to a data pattern can be minimized.

Thereafter, at a second point of time "t2", when the high voltage enable signal HV_T2 is enabled, the high voltage charging unit 418 drives the sensing control node PB_SO to the level of the high voltage PBPMP so that the sensing control signal PB_SENSE is additionally driven when the sensing control signal PB_SENSE has not risen to a sufficient level.

Thereafter, at a third point of time "t3", when the discharge signal DCG is enabled, the discharge unit 414 discharges the ramping node RAMP_SO to a ground voltage VSS in response to the discharge signal DCG.

Figure 6:
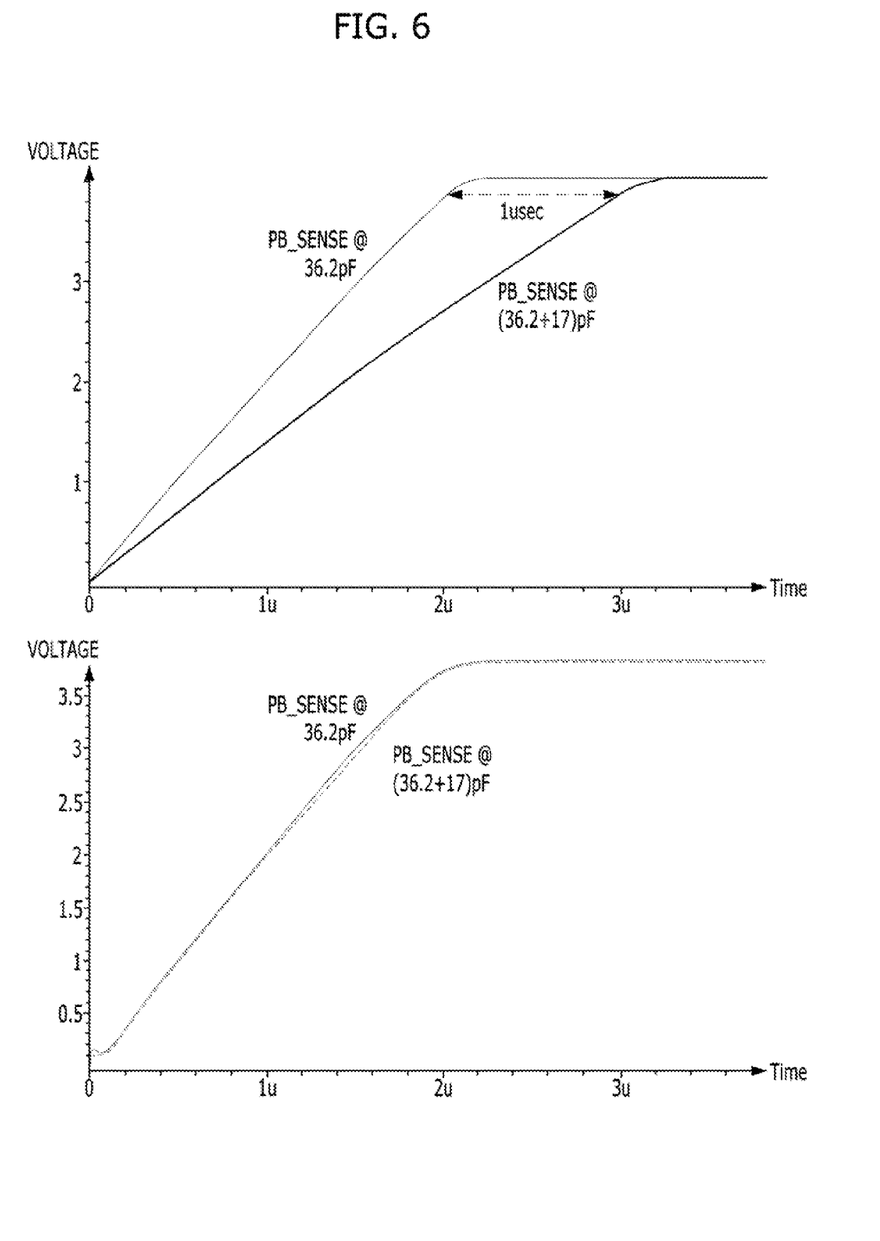
FIG. 6 is a waveform diagram illustrating a comparison between the slopes of a conventional sensing control signal and the sensing control signal of the present invention, according to a change of the total capacitance of the sensing control node.

FIG. 6 is a waveform diagram illustrating a comparison between the slopes of a conventional sensing control signal and the sensing control signal PB_SENSE of the present invention according to a change of total capacitance C_TOT of the sensing control node PB_SO. For reference, FIG. 6 shows only a portion corresponding to the sensing control signal PB_SENSE from the first point of time "t1" to the second point of time "t2" in FIG. 5.

According to the embodiment illustrated in FIG. 6, the sensing control signal PB_SENSE generated according to the prior art is generated at different slopes when total capacitance C_TOT of the sensing control node PB_SO is a first condition (i.e., 36.2 pF) and when total capacitance C_TOT of the sensing control node PB_SO is a second condition (i.e., 36.2±17 pF).

In contrast, the sensing control signal PB_SENSE generated according to the present invention can be generated at the same slope although total capacitance C_TOT of the sensing control node PB_SO changes from the first condition to the second condition.

As described above, the sensing control signal generation unit 240 according to an embodiment of the present invention can generate the sensing control signal PB_SENSE rising with a constant slope, that is, the sensing control signal PB_SENSE having a constant rising time, although total capacitance C_TOT of the sensing control node PB_SO changes according to a data pattern.

Figure 7:
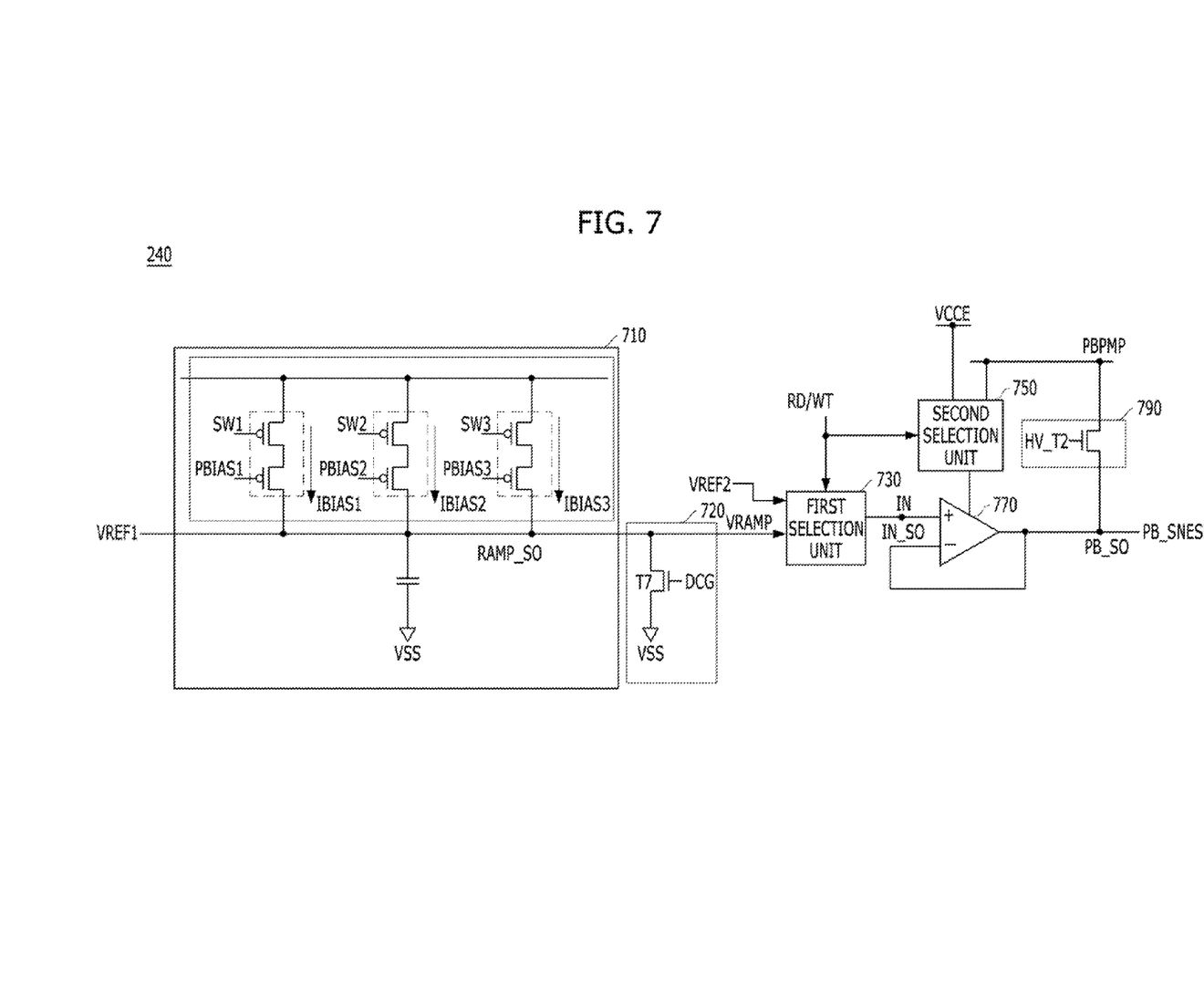
FIG. 7 is a circuit diagram of the sensing control signal generation unit of FIG. 2, according to another embodiment of the present invention.

FIG. 7 is a detailed circuit diagram of the sensing control signal generation unit 240 of FIG. 2, according to another embodiment of the present invention.

According to the embodiment illustrated in FIG. 7, the sensing control signal generation unit 240 may include a dynamic biasing unit 710, a first selection unit 730, a second selection unit 750, and a sensing control signal driving unit 770.

The dynamic biasing unit 710 may generate a ramping signal VRAMP through a ramping node RAMP_SO by charging an internal capacitor with one of biases IBIAS1, IBIAS2, and IBIAS3 having different intensities. The first selection unit 730 may select a second reference voltage VREF2 or the ramping signal VRAMP generated by the dynamic biasing unit 710 in response to a read/write signal WT/RD and output the selected signal as a driving input signal IN to a driving input node IN_SO. The second selection unit 750 may select an external power supply voltage VCCE or a high voltage PBPMP having a higher level than the power supply voltage VCCE in response to the read/write signal WT/RD, and output the selected signal as an operating voltage to the sensing control signal driving unit 770. The sensing control signal driving unit 770 may output the driving input signal IN as the sensing control signal PB_SENSE by driving the driving input node IN_SO while separating the driving input node IN_SO from the sensing control node PB_SO.

The sensing control signal generation unit 240 may further include a discharge unit 720 for discharging the ramping node RAMP_SO to the ground voltage VSS in response to a discharge signal DCG, and a high voltage charging unit 790 for driving the sensing control node PB_SO to the high voltage PBPMP after the sensing control signal PB_SENSE rises with a constant slope during a specific section of time so that the sensing control signal PB_SENSE is additionally driven when the sensing control signal PB_SENSE has not risen to a sufficient level.

For reference, the dynamic biasing unit 710 of FIG. 7 corresponds to the ramping signal generation unit 412 of FIG. 2, the discharge unit 720 of FIG. 7 corresponds to the discharge unit 414 of FIG. 2, and the high voltage charging unit 790 of FIG. 7 corresponds to the high voltage charging unit 418 of FIG. 2. Furthermore, the sensing control signal generation unit 240 of FIG. 7 is different from the sensing control signal generation unit 240 of FIG. 2 in that the sensing control signal driving unit 416 of the program sensing control signal generation unit 410 and the sensing control signal driving unit 432 of the read sensing control signal generation unit 430 in FIG. 2 are configured to share the single source follower in FIG. 7. A description of the same remaining elements is omitted.

The operation of the sensing control signal generation unit 240 of FIG. 7 is described below.

During the program operation, the first selection unit 730 selects the ramping signal VRAMP output by the dynamic biasing unit 710 and outputs the ramping signal VRAMP as the driving input signal IN to the driving input node IN_SO. The second selection unit 750 selects the high voltage PBPMP and supplies the high voltage PBPMP as the operating voltage of the sensing control signal driving unit 770. Accordingly, the sensing control signal generation unit 240 can generate the sensing control signal PB_SENSE as the ramping signal rising with a specific slope regardless of a data pattern, as described above with reference to FIG. 6.

Thereafter, during the read operation, the first selection unit 730 selects the second reference voltage VREF2 and outputs the second reference voltage VREF2 as the driving input signal IN to the driving input node IN_SO. The second selection unit 750 selects the external power supply voltage VCCE and supplies the external power supply voltage VCCE as the operating voltage of the sensing control signal driving unit 770. Accordingly, during the read operation, the sensing control signal generation unit 240 can generate the sensing control signal PB_SENSE as the level signal.

As described above, according to embodiments of the present invention, when generating the sensing control signal PB_SENSE to control coupling between a page buffer and a bit line, the semiconductor memory device may generate the sensing control signal PB_SENSE as a level signal during a read operation; and may generate the sensing control signal PB_SENSE as a ramping signal rising with a constant slope during a program operation.

In particular, when generating the sensing control signal PB_SENSE during a program operation, the semiconductor memory device generates a ramping signal having a constant slope by charging the capacitor insensitive to a skew change and generates the ramping signal as the sensing control signal PB_SENSE by driving the ramping node while separating the ramping node from the sensing control node using the source follower having a unit gain buffer. Accordingly, although total capacitance C_TOT of the sensing control node changes according to a data pattern, the sensing control signal PB_SENSE rising with the constant slope can be generated. As a result, the semiconductor memory device according to an embodiment has an advantage in that it can reduce a peak current variation depending on a data pattern.

Furthermore, the semiconductor memory device according to the embodiment has an advantage in that it can reduce a peak current variation depending on a change of a power supply voltage and temperature because it generates the sensing control signal using a bandgap signal having a compensated PVT variation.

Figure 8:
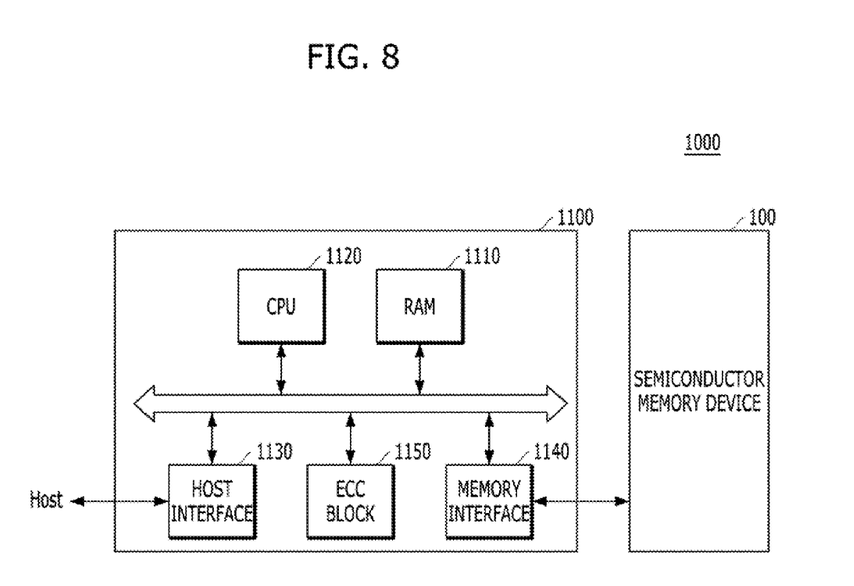
FIG. 8 is a block diagram illustrating a memory system including the semiconductor memory device shown in FIG. 1.

FIG. 8 is a block diagram illustrating a memory system including the semiconductor memory device 100 shown in FIG. 1.

According to the embodiment illustrated in FIG. 8, the memory system 1000, according to an embodiment, may include the semiconductor memory device 100 and a controller 1100.

Since the semiconductor memory device 100 is configured and manufactured as described above with reference to FIG. 1, a detailed description thereof will be omitted.

The controller 1100 may be connected to a host and the semiconductor memory device 100 and may be suitable for accessing the semiconductor memory device 100 in response to a request from the host. For example, the controller 1100 may be suitable for controlling read, write, erase and background operations of the semiconductor memory device 100. The controller 1100 may be suitable for performing interfacing between the semiconductor memory device 100 and the host. The controller 1100 may be suitable for operating firmware to control the semiconductor memory device 100.

The controller 1100 may include random access memory (RAM) 1110, a central processing unit (CPU) 1120, a host interface 1130, a memory interface 1140, and an error correction code (ECC) block 1150. The RAM 1110 may be used as an operation memory of the CPU 1120, a cache memory between the memory device 1200 and the host, and a buffer memory between the memory device 1200 and the host. The CPU 1120 may control the overall operation of the controller 1100. The controller 1100 may temporarily store program data provided from the host during a read operation.

The host interface 1130 may include a protocol for data exchange between the host and the controller 1100. For example, the controller 1100 may communicate with the host through at least one of various protocols such as a Universal Serial Bus (USB) protocol, a Multimedia Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol and a private protocol.

The memory interface 1140 may be suitable for performing interfacing with the semiconductor memory device 100. For example, the memory interface 1140 may include a NAND flash interface or a NOR flash interface.

The ECC block 1150 may be suitable for detecting and correcting errors in data read from the semiconductor memory device 100 using an error correcting code. The CPU 1120 may control a read voltage according to an error detection result of the ECC block 1150 and control the semiconductor memory device 100 to perform a re-read operation. According to an embodiment, the ECC block may be provided as a component of the controller 1100.

The controller 1100 and the semiconductor memory device 100 may be integrated in one semiconductor device. According to an embodiment, the controller 1100 and the semiconductor memory device 100 may be integrated in a single semiconductor device to form a memory card such as a personal computer memory card international association (PCMCIA), a compact flash card (CF), a smart media card (SMC), a memory stick, a multimedia card (MMC), a reduced size MMC (RS-MMC), a micro-MMC, a secure digital (SD) card, a mini-SD, a micro-SD, an SDHC, a universal flash storage device (UFS), and the like.

The controller 1100 and the semiconductor memory device 100 may be integrated in one semiconductor device to form a semiconductor drive, e.g., a Solid State Drive (SSD). The semiconductor drive (SSD) may include a storage device configured to store data in a semiconductor memory. When the memory system 2000 is used as the semiconductor drive (SSD), the operating speed of the host coupled to the memory system 1000 may be significantly improved.

In another example, the memory system 1000 may be used as one of various components of an electronic device, such as a computer, an ultra mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home networks, one of various electronic devices for computer networks, one of various electronic devices for telematics networks, an RFID device and/or one of various devices for computing systems, and the like.

In an exemplary embodiment, the semiconductor memory device 100 or the memory system 1000 may be packaged in a variety of ways. For example, in some embodiments, the semiconductor memory device 100 or the memory system 1000 may be packaged using various methods such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi-chip package (MCP), a wafer-level fabricated package (WFP) and/or a wafer-level processed stack package (WSP), and the like.

Figure 9:
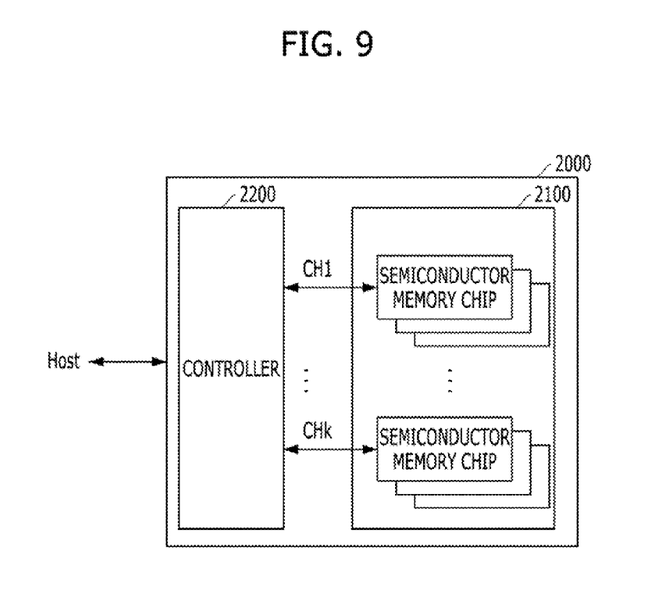
FIG. 9 is a block diagram illustrating an application example of the memory system shown in FIG. 8, according to an embodiment of the present invention.

FIG. 9 is a block diagram illustrating an application example 2000 of the memory system 1000 shown in FIG. 8.

According to the embodiment illustrated in FIG. 9, the memory system 2000 may include a semiconductor memory device 2100 and a controller 2200. The semiconductor memory device 2100 may include a plurality of semiconductor memory chips. The semiconductor memory chips may be divided into a plurality of groups.

In FIG. 9, the plurality of groups in the in the semiconductor memory chips communicate with the controller 2200 through first to k-th channels CH1 to CHk, respectively. Each of the memory chips may be configured and operated in substantially the same manner as the semiconductor memory device 100 described above with reference to FIG. 1.

Each of the groups in the semiconductor memory chips may communicate with the controller 2200 through a single common channel. The controller 2200 may be configured in substantially the same manner as the controller 1100 described above with reference to FIG. 8 and may control the plurality of memory chips of the semiconductor memory device 2100.

Figure 10:
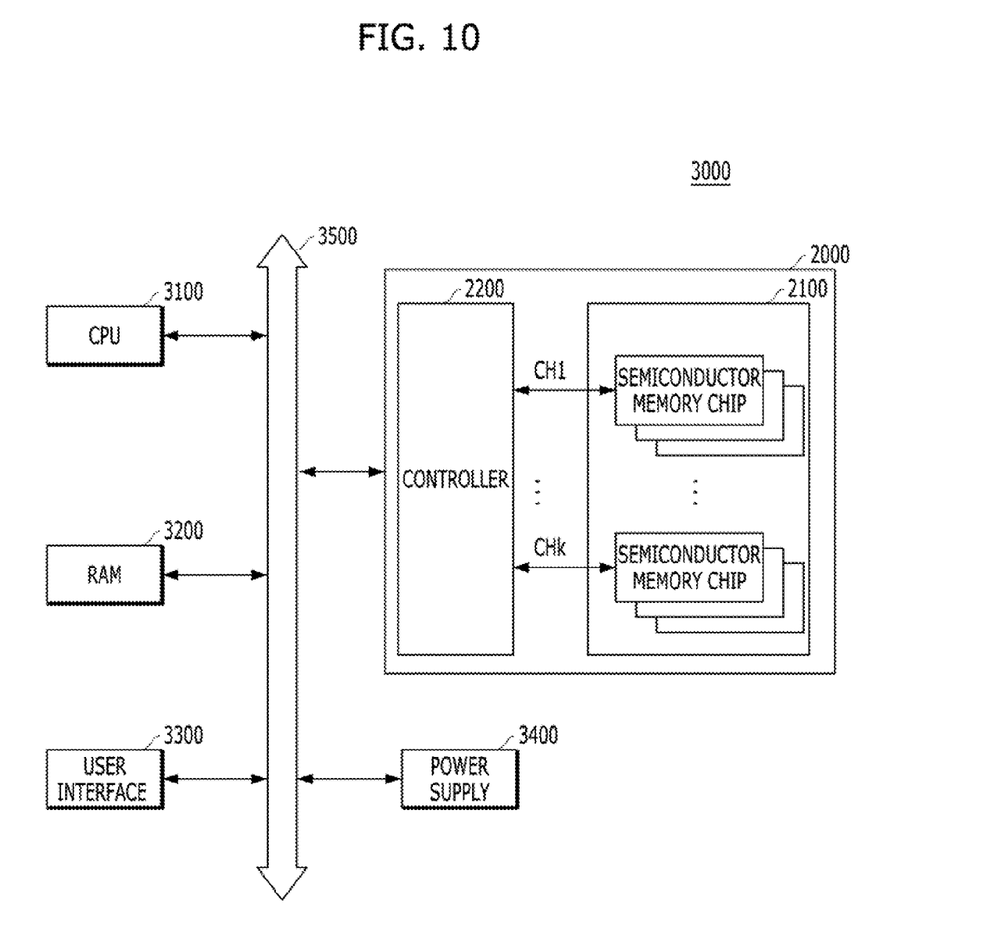
FIG. 10 is a block diagram illustrating a computing system including the memory system shown in FIG. 9, according to an embodiment of the invention.

FIG. 10 is a block diagram illustrating a computing system including the memory system shown in FIG. 9, according to an embodiment of the invention.

According to the embodiment illustrated in FIG. 10, the computing system 3000 may include a central processing unit 3100, random access memory (RAM) 3200, a user interface 3300, a power supply 3400, a system bus 3500, and the memory system 2000.

The memory system 2000 may be electrically connected to the central processing unit 3100, the RAM 3200, the user interface 3300 and the power supply 3400 through the system bus 3500 Data provided through the user interface 3300 or processed by the central processing unit 3100 may be stored in the memory system 2000.

In FIG. 10, the semiconductor memory device 2100 may be coupled to the system bus 3500 through the controller 2200. However, the semiconductor memory device 2100 may be directly coupled to the system bus 3500. Functions of the controller 2200 may be performed by the central processing unit 3100 and the RAM 3200.

FIG. 10 illustrates the memory system 2000 described above with reference to FIG. 9. However, the memory system 2000 may be replaced with the memory system 1000 described above with reference to FIG. 8. In an exemplary embodiment, the computing system 3000 may include both memory systems 1000 and 2000 described above with reference to FIGS. 8 and 9, respectively.

Although various embodiments have been described for illustrative purposes, it will be apparent to those skilled in the relevant art that various changes and modifications may be made without departing from the spirit and/or scope of the invention as defined in the following claims.

For example, the positions and types of the logic gates and transistors illustrated in the aforementioned embodiments may have been differently implemented depending on the polarity of an input signal.

Moreover, in some instances, as would be apparent to those skilled in the relevant art elements described in connection with a particular embodiment may be used singly or in combination with other embodiments unless otherwise specifically indicated.

What is claimed is:

1. A semiconductor memory device, comprising:
    a memory block comprising a plurality of cell strings respectively coupled to a plurality of bit lines;
    page buffers coupled to the respective bit lines in response to a sensing control signal, each page buffer suitable for sensing a voltage of the respective bit line transferred to a sensing node; and
    a sensing control signal generation unit suitable for generating the sensing control signal as a ramping signal rising with a constant slope during a program operation.

2. The semiconductor memory device of claim 1, wherein each of the page buffers comprises:
    a coupling unit suitable for electrically coupling a corresponding bit line and the sensing node in response to the sensing control signal;
    a precharge unit suitable for precharging the sensing node to a precharge voltage level in response to a precharge signal; and
    a latch unit coupled to the sensing node, and suitable for temporarily storing data to be programmed into a selected memory cell through the bit line and data read from a corresponding cell string through the corresponding bit line.

3. The semiconductor memory device of claim 1, wherein the sensing control signal generation unit comprises:
    a ramping signal generation unit suitable for generating the ramping signal at a ramping node by charging an internal capacitor with one or more of biases having different intensities; and
    a sensing control signal driving unit suitable for outputting the ramping signal as the sensing control signal by driving the ramping node while separating the ramping node from a sensing control node.

4. The semiconductor memory device of claim 3, wherein the ramping signal generation unit comprises:
    a current source suitable for selecting one or more of the biases; and
    a capacitor suitable for generating the ramping signal at the ramping node using the selected biases.

5. The semiconductor memory device of claim 4, wherein the current source generates the biases in response to a bandgap signal having a compensated PVT variation.

6. The semiconductor memory device of claim 4,
    wherein the current source comprising first to third biasing units coupled in parallel between a high voltage node and the ramping node,
    wherein each of the first to the third biasing units comprises first and second transistors coupled in series between the high voltage node and the ramping node,
    wherein the first transistor is operable in response to one of first to third switch signals, and
    wherein the second transistor is operable in response to one first to third bandgap signals.

7. The semiconductor memory device of claim 4, wherein the capacitor is insensitive to a skew change.

8. The semiconductor memory device of claim 7, wherein the capacitor comprises an oxide-nitride-oxide layer (ONO) capacitor.

9. The semiconductor memory device of claim 3, wherein the sensing control signal driving unit comprises a source follower having a unit gain buffer receiving a high voltage as a driving voltage.

10. The semiconductor memory device of claim 3, further comprising:
    a discharge unit suitable for discharging the ramping node to a ground voltage in response to a discharge signal; and
    a high voltage charging unit suitable for driving the sensing control node to a high voltage after the sensing control signal rises with a constant slope.

11. The semiconductor memory device of claim 1, wherein the sensing control signal generation unit generates the sensing control signal as a level signal during a read operation.

12. The semiconductor memory device of claim 11, wherein the sensing control signal generation unit comprises a source follower having a unit gain buffer for generating the sensing control signal as the level signal during the read operation.

13. The semiconductor memory device of claim 11, wherein the sensing control signal generation unit comprises:
- a dynamic biasing unit suitable for generating a ramping signal through a ramping node by charging an internal capacitor with one or more of biases having different intensities;
- a first selection unit suitable for selecting a reference voltage or the ramping signal in response to a program/read signal, and outputting the selected voltage or signal as a driving input signal through a driving input node;
- a second selection unit suitable for selecting a power supply voltage or a high voltage higher than the power supply voltage in response to the program/read signal; and
- a sensing control signal driving unit suitable for receiving a voltage from the second selection unit as an operating voltage, and outputting the driving input signal as the sensing control signal.

14. The semiconductor memory device of claim 13, wherein the dynamic biasing unit comprises:
- a current source suitable for selecting one or more of the biases, and providing the selected biases; and
- a capacitor suitable for generating the ramping signal at the ramping node using the selected biases.

15. The semiconductor memory device of claim 14, wherein the capacitor comprises an oxide-nitride-oxide layer (ONO) capacitor insensitive to a skew change.

16. The semiconductor memory device of claim 13, further comprising:
- a discharge unit suitable for discharging the ramping node to a ground voltage in response to a discharge signal; and
- a high voltage charging unit suitable for driving the sensing control node to the high voltage after the sensing control signal rises with a constant slope.

17. A sensing control signal generation circuit, comprising:
- a program sensing control signal generation unit suitable for generating a sensing control signal as a ramping signal rising with a specific slope regardless of a data pattern during a program operation; and
- a read sensing control signal generation unit suitable for generating the sensing control signal as a level signal during a read operation.

18. The sensing control signal generation circuit of claim 16, wherein the program sensing control signal generation unit comprises:
- a ramping signal generation unit suitable for generating the ramping signal at a ramping node by charging an internal capacitor with one or more of biases having different intensities;
- a discharge unit suitable for discharging the ramping node to a ground voltage in response to a discharge signal;
- a sensing control signal driving unit suitable for outputting the ramping signal as the sensing control signal; and
- a high voltage charging unit suitable for driving the sensing control node to a high voltage after the sensing control signal rises with a constant slope.

19. The sensing control signal generation circuit of claim 16, wherein the read sensing control signal generation unit comprises a source follower having a unit gain buffer.

20. A method for generating a sensing control signal, comprising:
- precharging a ramping node to a reference voltage during an initial period;
- at a first point of time, selecting one or more of biases having different intensities, providing the selected biases to the ramping node, generating a ramping signal rising with a specific slope at the ramping node by charging an internal capacitor with the selected biases, and outputting the ramping signal as a sensing control signal at a sensing control node by driving the ramping node while separating the ramping node from the sensing control node; and
- at a second point of time, additionally driving the sensing control node to a high voltage.

21. The method of claim 20, further comprising discharging the ramping node to a ground voltage at a third point of time.

* * * * *